United States Patent
Fujii et al.

(10) Patent No.: US 12,131,910 B2
(45) Date of Patent: Oct. 29, 2024

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventors: Motoki Fujii, Yokkaichi (JP); Hiroshi Kubota, Yokkaichi (JP); Fumiki Aiso, Kuwana (JP)

(73) Assignee: Kioxia Corporation, Tokyo (JP)

( * ) Notice: Subject to any disclaimer, the term of this patent is extended or adjusted under 35 U.S.C. 154(b) by 425 days.

(21) Appl. No.: 17/474,973

(22) Filed: Sep. 14, 2021

(65) Prior Publication Data
US 2022/0270885 A1    Aug. 25, 2022

(30) Foreign Application Priority Data

Feb. 25, 2021   (JP) .................... 2021-029111

(51) Int. Cl.
*H01L 21/30* (2006.01)
*C01B 5/02* (2006.01)
*H01L 21/67* (2006.01)

(52) U.S. Cl.
CPC ............ *H01L 21/3003* (2013.01); *C01B 5/02* (2013.01); *H01L 21/67017* (2013.01)

(58) Field of Classification Search
CPC .......... H01L 21/3003; H01L 21/67017; H01L 21/67109; H01L 21/324; C01B 5/02; C01B 4/00; B01D 5/00; H10B 43/27; H10B 43/30
See application file for complete search history.

(56) References Cited

U.S. PATENT DOCUMENTS

| | | | |
|---|---|---|---|
| 6,863,019 B2 | 3/2005 | Shamouilian et al. | |
| 2011/0023908 A1* | 2/2011 | Neuber | B08B 7/0035 134/10 |
| 2018/0209051 A1 | 7/2018 | Baker et al. | |

FOREIGN PATENT DOCUMENTS

| | | | |
|---|---|---|---|
| JP | 62-7602 A | 1/1987 | |
| JP | 5-226346 A | 9/1993 | |
| JP | 2002-75973 A | 3/2002 | |
| JP | 2020-505218 A | 2/2020 | |
| KR | 2011075907 A | * | 7/2011 |

* cited by examiner

*Primary Examiner* — Dale E Page
*Assistant Examiner* — Quovaunda Jefferson
(74) *Attorney, Agent, or Firm* — Oblon, McClelland, Maier & Neustadt, L.L.P.

(57) ABSTRACT

In one embodiment, a semiconductor manufacturing apparatus includes a substrate processor configured to process a substrate with a gas of a first substance and a gas of a second substance, and discharge a first gas including the first substance and/or the second substance. The apparatus further includes a disposer configured to discard the first gas discharged from the substrate processor. The apparatus further includes a recoverer configured to generate a second gas including the second substance by using the first substance in the first gas discharged from the substrate processor, and supply the second gas to the substrate processor.

4 Claims, 6 Drawing Sheets

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2021-029111, filed on Feb. 25, 2021, the entire contents of which are incorporated herein by reference.

FIELD

Embodiments described herein relate to a semiconductor manufacturing apparatus and a method of manufacturing a semiconductor device.

BACKGROUND

When a substrate is processed with gas in a reactor, exhaust gas discharged from the reactor may include the gas that has not been consumed in the reactor. If such exhaust gas is discarded, the gas that has not been consumed in the reactor is wastefully discarded.

DETAILED DESCRIPTION

Embodiments will now be explained with reference to the accompanying drawings. In FIGS. 1 to 6, identical components are denoted by identical reference signs, and repeated descriptions of such components will be omitted.

In one embodiment, a semiconductor manufacturing apparatus includes a substrate processor configured to process a substrate with a gas of a first substance and a gas of a second substance, and discharge a first gas including the first substance and/or the second substance. The apparatus further includes a disposer configured to discard the first gas discharged from the substrate processor. The apparatus further includes a recoverer configured to generate a second gas including the second substance by using the first substance in the first gas discharged from the substrate processor, and supply the second gas to the substrate processor.

First Embodiment

Figure 1:
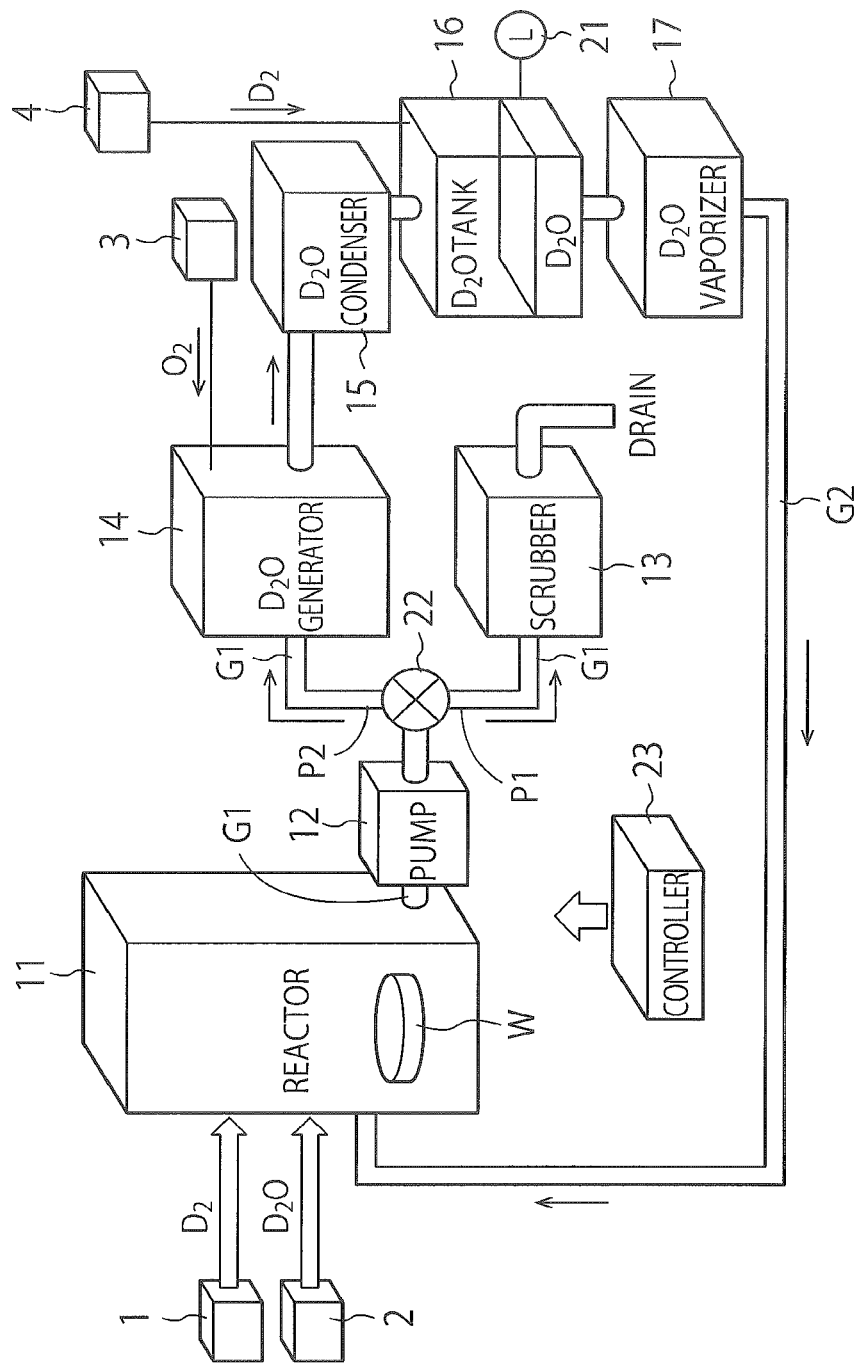
FIG. 1 is a perspective view schematically illustrating the configuration of a semiconductor manufacturing apparatus of a first embodiment.

FIG. 1 is a perspective view schematically illustrating the configuration of a semiconductor manufacturing apparatus of a first embodiment.

The semiconductor manufacturing apparatus in FIG. 1 includes a reactor 11, a pump 12, a scrubber 13, a $D_2O$ generator 14, a $D_2O$ condenser 15, a $D_2O$ tank 16, a $D_2O$ vaporizer 17, a level gage 21, a valve 22, and a controller 23 (D represents deuterium and O represents oxygen). The reactor 11 is an example of a substrate processor, and the $D_2O$ tank 16 is an example of a container. Further, the level gage 21 is an example of a measuring instrument, and the valve 22 is an example of a switch. The semiconductor manufacturing apparatus in FIG. 1 further includes a $D_2$ supplier 1, a $D_2O$ supplier 2, an $O_2$ supplier 3, and a $D_2$ supplier 4.

The semiconductor manufacturing apparatus in FIG. 1 further includes a flow channel P1 of a disposal system and a flow channel P2 of a recovery system. The scrubber 13 is provided on the flow channel P1, and forms the disposal system of the semiconductor manufacturing apparatus in the present embodiment. The $D_2O$ generator 14, the $D_2O$ condenser 15, the $D_2O$ tank 16, and the $D_2O$ vaporizer 17 are provided on the flow channel P2, and form the recovery system of the semiconductor manufacturing apparatus in the present embodiment. The flow channel P1 and the scrubber 13 are examples of a disposer. Meanwhile, the flow channel P2, the $D_2O$ generator 14, the $D_2O$ condenser 15, the $D_2O$ tank 16, and the $D_2O$ vaporizer 17 are examples of a recoverer. The flow channel P1 extends from the valve 22. The flow channel P2 extends from the valve 22 to the reactor 11.

The reactor 11 contains a substrate (i.e., a wafer) W as a processing target, and processes the contained substrate W with gas. The reactor 11 of the present embodiment processes the substrate W with a $D_2$ gas (i.e., deuterium gas) and a $D_2O$ gas (i.e., deuterium oxide gas). Consequently, a substance in the substrate W chemically reacts with the $D_2$ gas and the $D_2O$ gas. Gas generated through such chemical reaction as well as a $D_2$ gas and a $D_2O$ gas, which have not chemically reacted with the substance in the substrate W, are discharged as exhaust gas from the reactor 11. In FIG. 1, the exhaust gas is indicated by a "gas G1." The reactor 11 of the present embodiment is an annealing furnace that anneals the substrate W with a $D_2$ gas and a $D_2O$ gas. $D_2$ is an example of a first substance, and $D_2O$ is an example of a second substance. In addition, the gas G1 is an example of a first gas.

The reactor 11 receives a $D_2$ gas from the $D_2$ supplier 1 and receives a $D_2O$ gas from the $D_2O$ supplier 2, for example, and processes the substrate W with the $D_2$ gas and the $D_2O$ gas. A $D_2$ gas received from components other than the $D_2$ supplier 1 and a $D_2O$ gas received from components other than the $D_2O$ supplier 2 will be described below.

The pump 12 sends the gas G1 discharged from the reactor 11 to the flow channel P1 or the flow channel P2 via the valve 22. The valve 22 is a three-way valve, for example, and the valve 22 is allowed to communicate with one of the flow channel P1 or the flow channel P2. Therefore, the valve 22 can switch the discharge destination of the gas G1 between the flow channel P1 and the flow channel P2.

The scrubber 13 scrubs the gas G1 that has flowed into the scrubber 13 from the valve 22. The scrubber 13 of the present embodiment scrubs the gas G1 by diluting the gas G1 with another gas and changing the $D_2$ gas in the gas G1 into a $D_2O$ gas through burning. This makes it possible to prevent the gas G1 from burning after being discarded. The gas used for dilution is an $N_2$ gas (i.e., nitrogen gas) or an $H_2O$ gas (i.e., water gas (water vapor)), for example. The gas G1 scrubbed by the scrubber 13 is discharged as drain from the scrubber 13. In this manner, the gas G1 is discarded.

The $D_2O$ generator 14 causes the $D_2$ gas in the gas G1, which has flowed into the $D_2O$ generator 14 from the valve 22, to react with an $O_2$ gas (i.e., oxygen gas) received from the $O_2$ supplier 3. Consequently, a $D_2O$ gas is generated from the $D_2$ gas and the $O_2$ gas. The $D_2O$ generator 14 may generate the $D_2O$ gas either by burning the $D_2$ gas with the $O_2$ gas or by causing a catalytic reaction to occur between the $D_2$ gas and the $O_2$ gas.

The $D_2O$ condenser 15 condenses the $D_2O$ gas discharged from the $D_2O$ generator 14, that is, changes $D_2O$ in a gas state into $D_2O$ in a liquid state. This makes it possible to generate a high-purity $D_2O$ liquid.

The $D_2O$ tank 16 contains the $D_2O$ liquid discharged from the $D_2O$ condenser 15. In this manner, the gas G1 is recovered in the form of a $D_2O$ liquid into the $D_2O$ tank 16 for recycling purposes. As described below, the $D_2O$ liquid in the $D_2O$ tank 16 is reused as a $D_2O$ gas in the reactor 11. The $D_2O$ liquid in the $D_2O$ tank 16 may be, instead of being recycled in such a manner, recycled by being used as a raw material for generating a $D_2$ gas. The $D_2O$ tank 16 of the present embodiment includes a level gage 21 that measures the liquid level of a $D_2O$ liquid in the $D_2O$ tank 16. Accordingly, the amount of the $D_2O$ liquid in the $D_2O$ tank 16 can be measured through the liquid level.

The $D_2O$ tank 16 may, instead of recovering $D_2O$ by containing the $D_2O$ liquid discharged from the $D_2O$ condenser 15, recover $D_2O$ by mixing the $D_2O$ gas discharged from the $D_2O$ generator 14 into a $D_2O$ liquid in the $D_2O$ tank 16.

The $D_2O$ vaporizer 17 vaporizes the $D_2O$ liquid discharged from the $D_2O$ tank 16, that is, changes $D_2O$ in a liquid state into $D_2O$ in a gas state. This makes it possible to generate a high-purity $D_2O$ gas. The $D_2O$ vaporizer 17 further receives a $D_2$ gas that has been introduced into the $D_2O$ tank 16 from the $D_2$ supplier 4. The $D_2O$ vaporizer 17 of the present embodiment discharges a "gas G2" including such a $D_2O$ gas and a $D_2$ gas. The $D_2$ gas is used as a carrier for sending the $D_2O$ gas. The gas G2 is supplied to the reactor 11 via the flow channel P2, and is used as a $D_2O$ gas and a $D_2$ gas in the reactor 11. The gas G2 is an example of a second gas.

The controller 23 controls various operations of the semiconductor manufacturing apparatus in FIG. 1. The controller 23 of the present embodiment receives measurement data on the liquid level in the $D_2O$ tank 16 from the level gage 21, and controls the valve 22 based on the received measurement data. For example, when the liquid level in the $D_2O$ tank 16 is higher than a threshold, the $D_2O$ tank 16 contains a sufficient amount of a $D_2O$ liquid. Therefore, the valve 22 may be allowed to communicate with the flow channel P1 so that the gas G1 is discarded. Meanwhile, when the liquid level in the $D_2O$ tank 16 is lower than the threshold, the amount of a $D_2O$ liquid in the $D_2O$ tank 16 is not sufficient. Therefore, the valve 22 may be allowed to communicate with the flow channel P2 so that the gas G1 is recovered. The details of the controller 23 will be described below.

As described above, the semiconductor manufacturing apparatus of the present embodiment can recover the gas G1 discharged from the reactor 11 for recycling purposes. Therefore, the present embodiment makes it possible to suppress wasteful discarding of a $D_2$ gas in the gas G1. This makes it possible to reduce the amount of a $D_2$ gas used, and reduce the running cost of the semiconductor manufacturing apparatus. Since a $D_2$ gas is typically expensive, the present embodiment makes it possible to significantly reduce the running cost of the semiconductor manufacturing apparatus.

In addition, the semiconductor manufacturing apparatus of the present embodiment includes the $D_2O$ vaporizer 17 on the stage following the $D_2O$ tank 16, and a $D_2O$ liquid that has accumulated in the $D_2O$ tank 16 is automatically supplied to the reactor 11 via the $D_2O$ vaporizer 17. If the $D_2O$ vaporizer 17 is not provided on the stage following the $D_2O$ tank 16, the $D_2O$ tank 16 frequently becomes full of a $D_2O$ liquid so that the $D_2O$ tank 16 should be replaced each time the $D_2O$ tank 16 becomes full. According to the present embodiment, since the $D_2O$ vaporizer 17 uses a $D_2O$ liquid that has accumulated in the $D_2O$ tank 16, the $D_2O$ tank 16 is less likely to become full of a $D_2O$ liquid. This makes it possible to reduce the frequency of replacement of the $D_2O$ tank 16.

The reactor 11 of the present embodiment is an annealing furnace that anneals the substrate W with a $D_2$ gas and a $D_2O$ gas. When the substrate W is annealed, it is often the case that only a little amount of such gases is consumed, Therefore, in such a case, a large amount of such gases may be wasted. Further, it is often the case that the substrate W is annealed for a long time. This also increases the amount of such gases used. The present embodiment makes it possible to significantly reduce the running cost of such an annealing furnace. A mechanism of an annealing furnace to discharge exhaust gas is typically often simple. Therefore, when the reactor 11 is an annealing furnace, it is often the case that a recovery system can be easily disposed on the stage following the reactor 11. The recovery system of the present embodiment may be applied to the reactor 11 other than an annealing furnace or to a device for processing the substrate W other than the reactor 11.

The reactor 11 of the present embodiment may process the substrate W with gas other than a $D_2$ gas and a $D_2O$ gas. For example, the reactor 11 of the present embodiment may process the substrate W with an $H_2$ gas (i.e., hydrogen gas) and an $H_2O$ gas. In such a case, the scrubber 13 burns $H_2$, and the $D_2O$ generator 14, the $D_2O$ condenser 15, the $D_2O$ tank 16, and the $D_2O$ vaporizer 17 process $H_2$ and $H_2O$.

The semiconductor manufacturing apparatus of the present embodiment may include only one of the $D_2$ suppliers 1 and 4 instead of including both the $D_2$ suppliers 1 and 4. For example, when a $D_2$ gas to be used by the reactor 11 can be sufficiently supplied from the $D_2$ supplier 4 alone, the $D_2$ supplier 1 need not be provided. In addition, when a $D_2O$ gas to be used by the reactor 11 can be sufficiently supplied from the $D_2O$ tank 16 alone, the $D_2O$ supplier 2 need not be provided.

The semiconductor manufacturing apparatus of the present embodiment may be sold by a manufacturer to a purchaser in such a form that all of the $D_2O$ generator 14, the $D_2O$ condenser 15, the $D_2O$ tank 16, and the $D_2O$ vaporizer 17 are included in the apparatus, or in such a form that at least one of the $D_2O$ generator 14, the $D_2O$ condenser 15, the $D_2O$ tank 16, and the $D_2O$ vaporizer 17 is not included in the apparatus. For example, the $D_2O$ tank 16 may be sold as an optional extra of the semiconductor manufacturing apparatus by a manufacturer to a purchaser, or be prepared by the purchaser. This also holds true for the $D_2O$ generator 14, the $D_2O$ condenser 15, and the $D_2O$ vaporizer 17.

Figure 2:
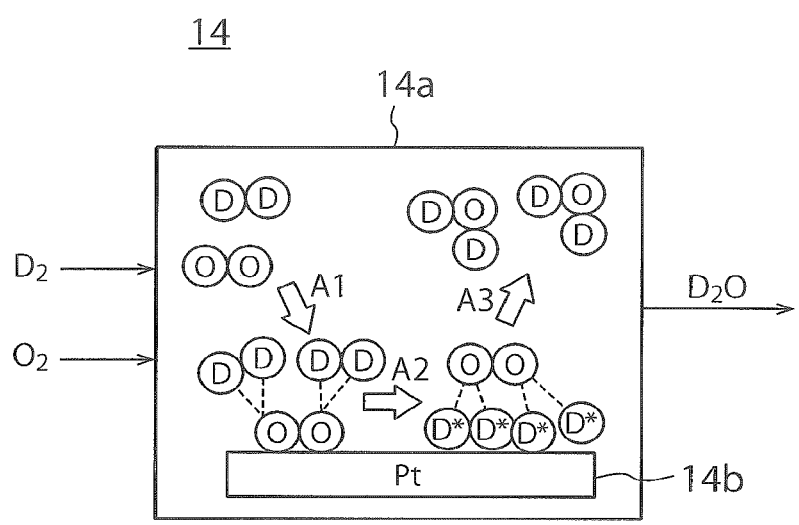
FIG. 2 is a cross-sectional view schematically illustrating an example of the configuration of a $D_2O$ generator of the first embodiment.

FIG. 2 is a cross-sectional view schematically illustrating an example of the configuration of the $D_2O$ generator 14 of the first embodiment.

The $D_2O$ generator 14 illustrated in FIG. 2 includes a reaction furnace 14a and a Pt (platinum) catalyst 14b in the reaction furnace 14a. In the reaction furnace 14a, a $D_2$ gas in the gas G1, which has flowed into the reaction furnace 14a from the valve 22, reacts with an $O_2$ gas introduced from the $O_2$ supplier 3 in a manner indicated by arrows A1, A2, and A3. The arrows A1 to A3 indicate a flow of a catalytic reaction that occurs between the $D_2$ gas and the $O_2$ gas by means of the Pt catalyst 14b. The reaction furnace 14a discharges a $D_2O$ gas generated through the catalytic reaction into the $D_2O$ condenser 15.

Figure 3:
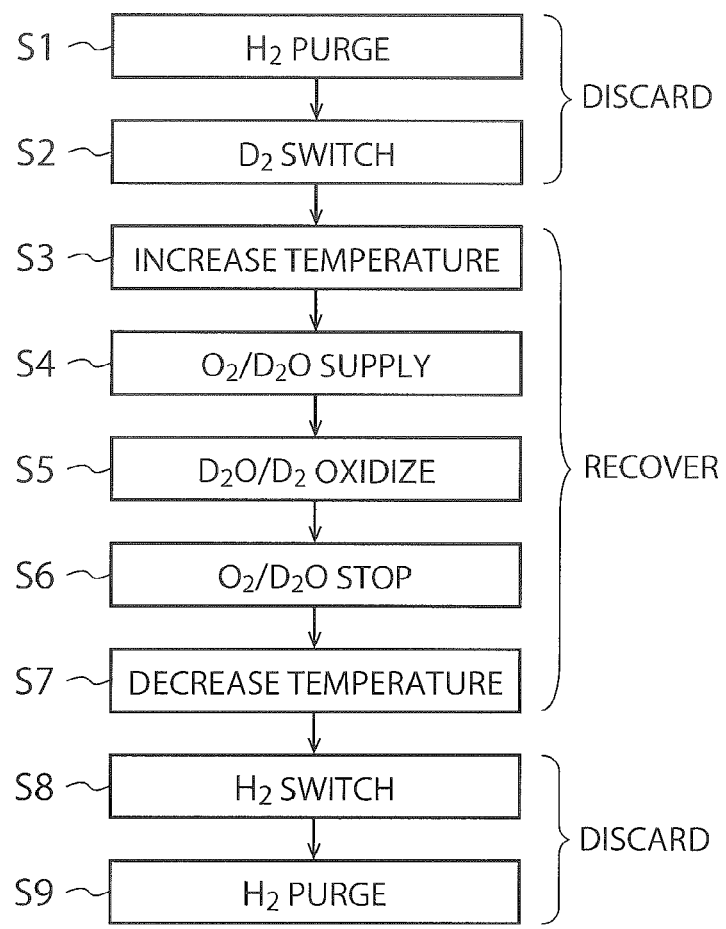
FIG. 3 is a flowchart illustrating an example of the operation of a reactor of the first embodiment.

FIG. 3 is a flowchart illustrating an example of the operation of the reactor 11 of the first embodiment.

First, after the substrate W is loaded into the reactor 11, $H_2$ in the reactor 11 is purged (step S1). Next, the gas supplied into the reactor 11 is switched from an $H_2$ gas to a $D_2$ gas (step S2). Next, the temperature in the reactor 11 is increased (step S3), and an $O_2$ gas and a $D_2O$ gas are supplied into the reactor 11 (step S4). Consequently, the substrate W is annealed, and a substance in the substrate W is oxidized by the $D_2$ gas and the $D_2O$ gas (step S5). Next, supply of the $O_2$ gas and the $D_2O$ gas into the reactor 11 is stopped (step S6), and the temperature in the reactor 11 is decreased (step S7). Next, the gas supplied into the reactor 11 is switched from the $D_2$ gas into an $H_2$ gas (step S8). Next, $H_2$ in the reactor 11 is purged, and the substrate W is taken out of the reactor 11 (step S9).

In FIG. 3, the gas G1 discharged from the reactor 11 is discarded in steps S1, S2, S8, and S9, and the gas G1 discharged from the reactor 11 is recovered in steps S3 to S7. Specifically, when steps S1, S2, S8, and S9 are performed, the valve 22 is allowed to communicate with the flow channel P1, and when steps S3 to S7 are performed, the valve 22 is allowed to communicate with the flow channel P2. In such cases, opening and closing of the valve 22 are controlled by the controller 23.

In steps S3 to S7, there are both cases where the gas G1 includes a $D_2$ gas but does not include a $D_2O$ gas and the gas G1 includes both a $D_2$ gas and a $D_2O$ gas. In the latter case, the $D_2$ gas in the gas G1 changes into a $D_2O$ gas in the $D_2O$ generator 14, and the $D_2O$ gas in the gas G1 passes through the $D_2O$ generator 14. Both of such $D_2O$ gases are condensed in the $D_2O$ condenser 15.

In steps S3 to S7, the controller 23 may allow the valve 22 to continuously communicate with the flow channel P2, or switch the communication destination of the valve 22 between the flow channels P1 and P2. For example, when the liquid level in the $D_2O$ tank 16 is higher than a threshold, the $D_2O$ tank 16 contains a sufficient amount of a $D_2O$ liquid. Therefore, the valve 22 may be allowed to communicate with the flow channel P1 so that the gas G1 is discarded. Meanwhile, when the liquid level in the $D_2O$ tank 16 is lower than the threshold, the amount of a $D_2O$ liquid in the $D_2O$ tank 16 is not sufficient. Therefore, the valve 22 may be allowed to communicate with the flow channel P2 so that the gas G1 is recovered.

Figure 4:
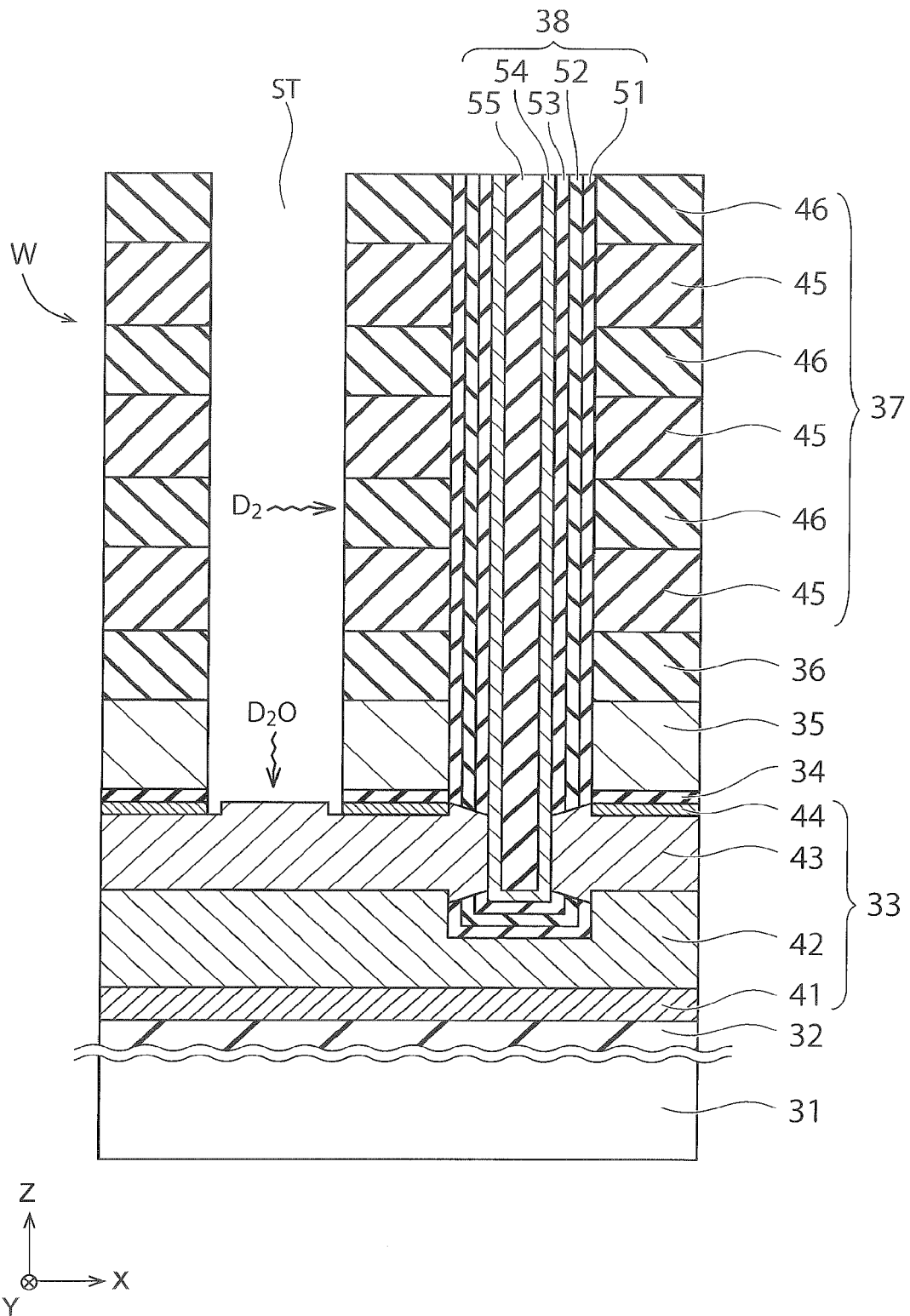
FIGS. 4 and 5 are cross-sectional views illustrating examples of a substrate of the first embodiment.
Figure 5:
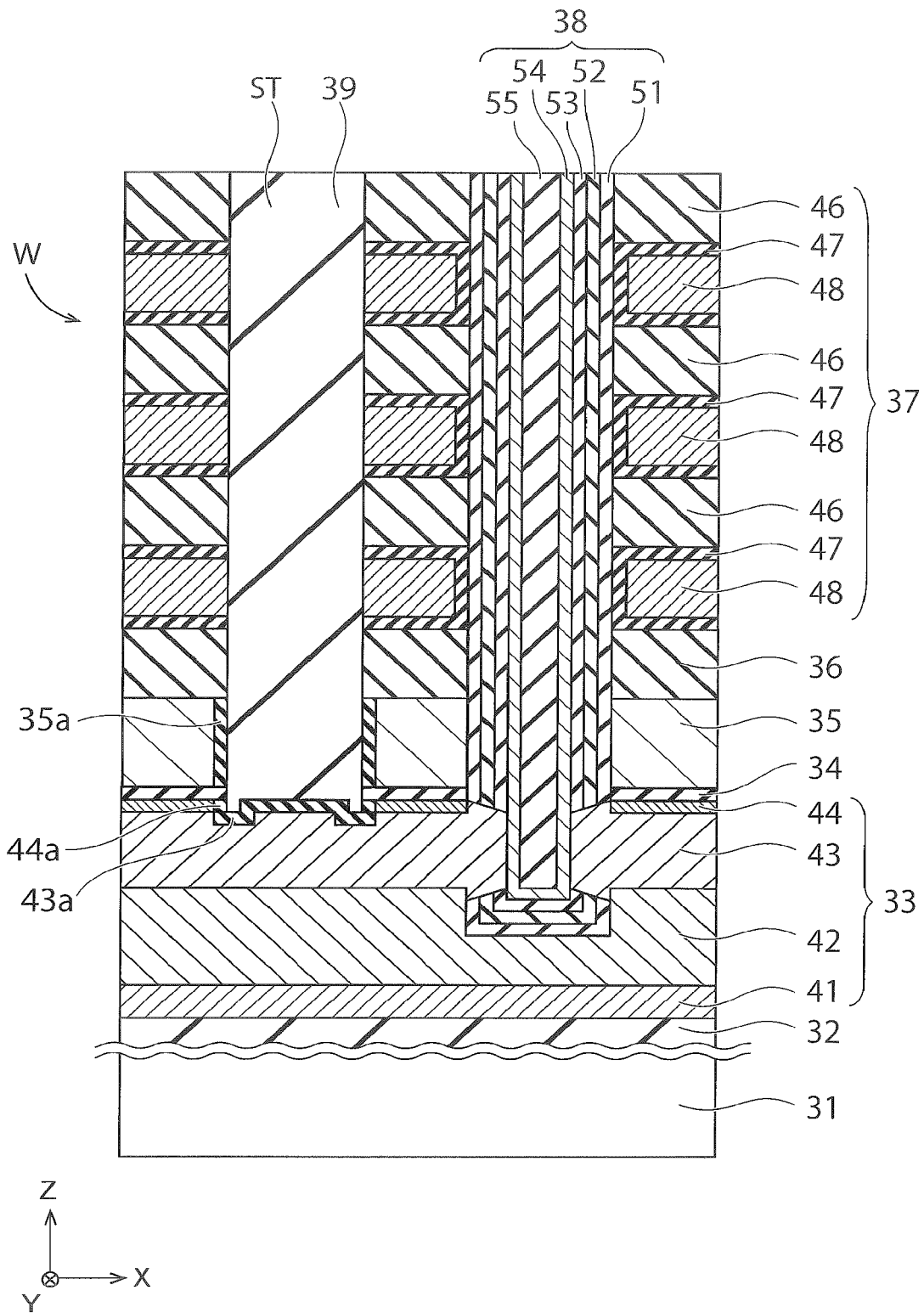

FIGS. 4 and 5 are cross-sectional views illustrating examples of the substrate W of the first embodiment.

FIG. 4 illustrates a view in which the substrate W in the reactor 11 is processed with a $D_2$ gas and a $D_2O$ gas. The substrate W illustrated in FIG. 4 is used to manufacture a three-dimensional memory as a semiconductor device, for example. FIG. 4 illustrates the X-direction, the Y-direction, and the Z-direction that are perpendicular to each other. In this specification, the +Z-direction is handled as the upward direction, and the -Z-direction is handled as the downward direction.

The substrate W illustrated in FIG. 4 includes a semiconductor substrate 31, an insulating layer 32, a source layer 33, an insulating layer 34, a gate layer 35, an insulating layer 36, a stacked film 37, and a columnar portion 38. The semiconductor substrate 31 is a Si (silicon) substrate, for example.

The insulating layer 32, the source layer 33, the insulating layer 34, the gate layer 35, the insulating layer 36, and the stacked film 37 are provided in this order over the semiconductor substrate 31. The columnar portion 38 is provided in the source layer 33, the insulating layer 34, the gate layer 35, the insulating layer 36, and the stacked film 37.

The source layer 33 includes a metal layer 41, a lower semiconductor layer 42, an intermediate semiconductor layer 43, and an upper semiconductor layer 44 that are provided in this order over the insulating layer 32. The stacked film 37 includes a plurality of sacrificial layers 45 and a plurality of insulating layers 46 alternately provided over the insulating layer 36. The columnar portion 38 includes a block insulating layer 51, a charge storage layer 52, a tunnel insulating layer 53, a channel semiconductor layer 54, and a core insulating layer 55 that are provided in this order in the source layer 33, the insulating layer 34, the gate layer 35, the insulating layer 36, and the stacked film 37. The channel semiconductor layer 54 is in contact with the intermediate semiconductor layer 43 as illustrated in FIG. 4.

The substrate W illustrated in FIG. 4 further includes a slit ST in the source layer 33, the insulating layer 34, the gate layer 35, the insulating layer 36, and the stacked film 37. A $D_2$ gas enters the columnar portion 38 via the slit ST and the stacked film 37. Consequently, D atoms are introduced into the columnar portion 38. Meanwhile, a $D_2O$ gas oxidizes the surfaces of the intermediate semiconductor layer 43, the upper semiconductor layer 44, and the gate layer 35, for example. Consequently, oxide films are formed on the surfaces of such layers. As with the $D_2$ gas, the $D_2O$ gas may enter the columnar portion 38 in addition to or instead of oxidizing the surfaces of such layers.

FIG. 5 illustrates the substrate W that has been processed with a $D_2$ gas and a $D_2O$ gas. FIG. 5 illustrates oxide films 43a, 44a, and 35a formed by oxidation in the intermediate semiconductor layer 43, the upper semiconductor layer 44, and the gate layer 35, respectively. In the present embodiment, after that, the substrate W is taken out of the reactor 11, and the sacrificial layers 45 are replaced with block insulating layers 47 and electrode layers 48, and then, an insulating layer 39 is embedded in the slit ST (FIG. 5). In this manner, a semiconductor device is manufactured from the substrate W.

As described above, the semiconductor manufacturing apparatus of the present embodiment includes a recovery system that recovers the gas G1 discharged from the reactor 11 for recycling purposes. Accordingly, the present embodiment makes it possible to suppress wasteful discarding of the gas G1 discharged from the reactor 11.

Second Embodiment

Figure 6:
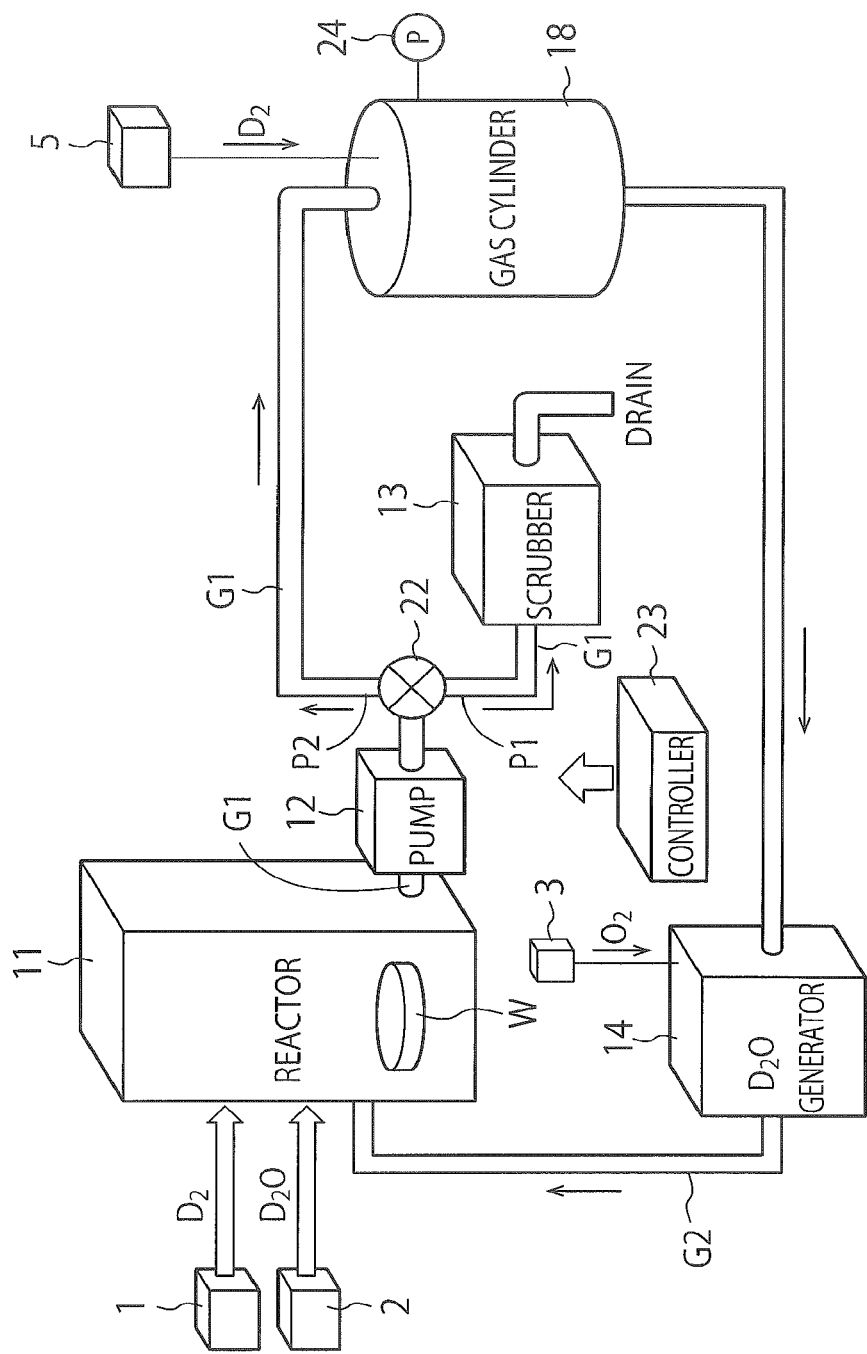
FIG. 6 is a perspective view schematically illustrating the configuration of a semiconductor manufacturing apparatus of a second embodiment.

FIG. 6 is a perspective view schematically illustrating the configuration of a semiconductor manufacturing apparatus of a second embodiment.

The semiconductor manufacturing apparatus in FIG. 6 has a configuration in which the $D_2O$ condenser 15, the $D_2O$ tank 16, the $D_2O$ vaporizer 17, the level gage 21, and the $D_2$ supplier 4 of the semiconductor manufacturing apparatus in FIG. 1 are replaced with a gas cylinder 18, a pressure gage 24, and a $D_2$ supplier 5. The gas cylinder 18 is an example of a container, and the pressure gage 24 is an example of a measuring instrument. In addition, the flow channel P2, the gas cylinder 18, and the $D_2O$ generator 14 are examples of a recoverer.

The gas cylinder 18 contains a gas G1 that has flowed into the gas cylinder 18 from the valve 22. In this manner, the gas G1 is recovered into the gas cylinder 18 for recycling purposes. As described below, the gas G1 in the gas cylinder 18 is reused as a $D_2O$ gas in the reactor 11. The gas G1 in the gas cylinder 18 may be, instead of being recycled in such a manner, recycled by being used as a raw material for generating a $D_2$ gas. The gas cylinder 18 can further receive a $D_2$ gas from the $D_2$ supplier 5 when the amount of gas in the gas cylinder 18 is insufficient, for example. The gas cylinder 18 of the present embodiment includes the pressure gage 24 that measures the pressure of gas in the gas cylinder 18. Accordingly, the amount of gas in the gas cylinder 18 can be measured through the pressure of the gas.

The $D_2O$ generator 14 of the present embodiment causes a $D_2$ gas in the gas discharged from the gas cylinder 18 to react with an $O_2$ gas introduced from the $O_2$ supplier 3. Consequently, a $D_2O$ gas is generated from the $D_2$ gas and the $O_2$ gas. The $D_2O$ generator 14 of the present embodiment may generate a $D_2O$ gas either by burning the $D_2$ gas with the $O_2$ gas or by causing a catalytic reaction to occur between the $D_2$ gas and the $O_2$ gas as illustrated in FIG. 2.

The gas discharged from the gas cylinder 18 may include a $D_2$ gas derived from the gas G1, or may include a $D_2$ gas derived from the $D_2$ supplier 5. Such $D_2$ gases will change into a $D_2O$ gas in the $D_2O$ generator 14. In addition, the gas discharged from the gas cylinder 18 may include a $D_2O$ gas derived from the gas G1. The $D_2O$ generator 14 of the present embodiment discharges a "gas G2" including such $D_2O$ gases. The gas G2 is supplied to the reactor 11 via the flow channel P2 and is used as a $D_2O$ gas in the reactor 11.

The controller 23 controls various operations of the semiconductor manufacturing apparatus in FIG. 6. The controller 23 of the present embodiment receives measurement data on the pressure in the gas cylinder 18 from the pressure gage 24, and controls the valve 22 based on the received measurement data. For example, when the pressure in the gas cylinder 18 is higher than a threshold, the gas cylinder 18 contains a sufficient amount of gas. Therefore, the valve 22 may be allowed to communicate with the flow channel P1 so that the gas G1 is discarded. Meanwhile, when the pressure in the gas cylinder 18 is lower than the threshold, the amount of gas in the gas cylinder 18 is insufficient. Therefore, the valve 22 may be allowed to communicate with the flow channel P2 so that the gas G1 is recovered.

As described above, the semiconductor manufacturing apparatus of the present embodiment can recover the gas G1 discharged from the reactor 11 for recycling purposes. Accordingly, the present embodiment makes it possible to suppress wasteful discarding of a $D_2$ gas in the gas G1 as in the first embodiment.

In addition, the semiconductor manufacturing apparatus of the present embodiment includes the $D_2O$ generator 14 on the stage following the gas cylinder 18, and gas that has accumulated in the gas cylinder 18 is automatically supplied to the reactor 11 via the $D_2O$ generator 14. If the $D_2O$ generator 14 is not provided on the stage following the gas cylinder 18, the pressure of gas in the gas cylinder 18 frequently becomes high so that the gas cylinder 18 should be replaced each time the pressure of gas in the gas cylinder 18 becomes high. According to the present embodiment, since the $D_2O$ generator 14 uses gas that has accumulated in the gas cylinder 18, the pressure of gas in the gas cylinder 18 is less likely to become high. This makes it possible to reduce the frequency of replacement of the gas cylinder 18.

The reactor 11 of the present embodiment may process the substrate W with gas other than a $D_2$ gas and a $D_2O$ gas. For example, the reactor 11 of the present embodiment may process the substrate W with an $H_2$ gas and an $H_2O$ gas. In such a case, the scrubber 13 burns $H_2$, and the gas cylinder 18 and the $D_2O$ generator 14 process $H_2$ and $H_2O$.

The semiconductor manufacturing apparatus of the present embodiment may include only one of the $D_2$ suppliers 1 and 5 instead of including both the $D_2$ suppliers 1 and 5. For example, when a $D_2$ gas to be used by the reactor 11 can be sufficiently supplied from the $D_2$ supplier 5 alone, the $D_2$ supplier 1 need not be provided. In addition, when a $D_2O$ gas to be used by the reactor 11 can be sufficiently supplied from the gas cylinder 18 and the $D_2O$ generator 14 alone, the $D_2O$ supplier 2 need not be provided.

The semiconductor manufacturing apparatus of the present embodiment may be sold by a manufacturer to a purchaser in such a form that both the gas cylinder 18 and the $D_2O$ generator 14 are included in the apparatus, or in such a form that at least one of the gas cylinder 18 and the $D_2O$ generator 14 is not included in the apparatus. For example, the gas cylinder 18 may be sold as an optional extra of the semiconductor manufacturing apparatus by a manufacturer to a purchaser, or be prepared by the purchaser. This also holds true for the $D_2O$ generator 14.

As described above, the semiconductor manufacturing apparatus of the present embodiment includes a recovery system that recovers the gas G1 discharged from the reactor 11 for recycling purposes. Accordingly, the present embodiment makes it possible to suppress wasteful discarding of the gas G1 discharged from the reactor 11 as in the first embodiment.

The recovery system of the present embodiment has an advantage in its simple configuration, for example, over the recovery system of the first embodiment. Meanwhile, the recovery system of the first embodiment has an advantage in that it can generate a high-purity $D_2O$ gas, for example, over the recovery system of the present embodiment. The descriptions made with reference to FIGS. 3, 4, and 5 in the first embodiment are also applicable to the present embodiment.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a substrate processor configured to process a substrate with a gas of a first substance and a gas of a second substance, and discharge a first gas including the first substance and/or the second substance;
   a disposer configured to discard the first gas discharged from the substrate processor; and
   a recoverer configured to generate a second gas including the second substance by using the first substance in the first gas discharged from the substrate processor, and supply the second gas to the substrate processor,
   wherein the recoverer includes:
   a generator configured to generate the second substance by using the first substance in the first gas; and a container configured to contain a liquid including the second substance generated by the generator, and
wherein the apparatus further comprises:
a measuring instrument configured to measure a liquid level of a liquid in the container;
a switch configured to switch a discharge destination of the first gas discharged from the substrate processor between the disposer and the recoverer; and
a controller configured to control the switch based on the liquid level measured by the measuring instrument.

2. A semiconductor manufacturing apparatus comprising:
a substrate processor configured to process a substrate with a gas of a first substance and a gas of a second substance, and discharge a first gas including the first substance and/or the second substance;
a disposer configured to discard the first gas discharged from the substrate processor; and
a recoverer configured to generate a second gas including the second substance by using the first substance in the first gas discharged from the substrate processor, and supply the second gas to the substrate processor,
wherein the recoverer includes:
a container configured to contain the first gas, and
wherein the apparatus further comprises:
a measuring instrument configured to measure a pressure of a gas in the container;
a switch configured to switch a discharge destination of the first gas discharged from the substrate processor between the disposer and the recoverer; and
a controller configured to control the switch based on the pressure measured by the measuring instrument.

3. A method of manufacturing a semiconductor device, comprising:
processing a substrate in a substrate processor by using a gas of a first substance and a gas of a second substance, and discharging a first gas including the first substance and/or the second substance from the substrate processor;
discarding, with a disposer, the first gas discharged from the substrate processor; and
generating, with a recoverer, a second gas including the second substance by using the first substance in the first gas discharged from the substrate processor, and supplying the second gas to the substrate processor,
wherein the first substance is $D_2$ or $H_2$ where H represents hydrogen and D represents deuterium, and the second substance is $D_2O$ or $H_2O$ where O represents oxygen.

4. The method of claim 3, wherein the recoverer causes $D_2$ or $H_2$ as the first substance to react with $O_2$ to generate $D_2O$ or $H_2O$ as the second substance.

* * * * *